United States Patent [19]

Thompson

[11] Patent Number: 5,186,634
[45] Date of Patent: Feb. 16, 1993

[54] ELECTRICAL CONTACT HAVING SPRING-BIASED TABS FOR MOUNTING TO A CIRCUIT BOARD

[75] Inventor: Bradley H. Thompson, Lynnwood, Wash.

[73] Assignee: John Fluke Mfg. Co., Inc., Everett, Wash.

[21] Appl. No.: 811,709

[22] Filed: Dec. 20, 1991

[51] Int. Cl.⁵ .............................................. H01R 9/09
[52] U.S. Cl. ..................................... 439/82; 439/83; 439/876
[58] Field of Search ................................. 439/80–83, 439/867, 876

[56] References Cited

U.S. PATENT DOCUMENTS

| | | | |
|---|---|---|---|
| 4,979,903 | 12/1990 | Gosselin | 439/82 |
| 5,006,073 | 4/1991 | Mennona, Jr. | 439/81 |
| 5,131,853 | 7/1992 | Meyer | 439/82 |

Primary Examiner—Paula A. Bradley
Attorney, Agent, or Firm—George T. Noe

[57] ABSTRACT

An electrical contact having one or more spring-biased tabs for mounting to a circuit board precludes the need for additional mechanical fasteners and obviates any additional manufacturing steps, except for soldering. The tabs are formed and shaped to provide springs which, when inserted into holes in a circuit board, compress and grip the interior wall of the hole.

4 Claims, 1 Drawing Sheet

ELECTRICAL CONTACT HAVING SPRING-BIASED TABS FOR MOUNTING TO A CIRCUIT BOARD

BACKGROUND OF THE INVENTION

This invention relates generally to electrical contacts, and in particular to an electrical contact having spring-biased tabs for mounting to a circuit board.

There are many conventional methods of mounting electronic components to printed circuit boards. It is typical to stuff a raw circuit board with components by so-called z-axis insertion and allow gravity to keep the components in place until they can be passed through a wave-soldering machine and soldered in. Sometimes the nature of the component (or the process) requires that the component be secured in some manner prior to the soldering process, for example, by bending or crimping leads or gluing; however, these techniques require an extra step in the process. Some components, such as connectors or electrical contacts, may be forced into a hole in a circuit board and held in place by friction until they can be soldered; however, in most cases a portion of the component protrudes from the board and requires clipping, which is yet another step. Finally, it is sometimes difficult to get a good solder fillet when leads extend through the board and protrude, leading to cold solder joints or poor mechanical connection.

It would be desirable to provide a component, such as an electrical contact, that could be mounted to a circuit board in such a way that allows z-axis insertion, that secures itself to the board without additional mechanical fasteners, that does not protrude an appreciable amount through the board, that provides a bridge for solder, that can be used on a single or multilayer circuit boards, and reduces the number of manufacturing assembly steps.

SUMMARY OF THE INVENTION

In accordance with the present invention, an electrical contact having spring-biased tabs for mounting to a circuit board solves the foregoing and other problems.

The electrical contact is formed of a resilient material, such as sheet phosphor bronze or nickel silver alloys, and is provided with at least one tab, which is formed and shaped to provide a spring. The overall dimensions of the tab are such that the tab does not protrude appreciably from the board, and grips the inner wall of the hole by compressing the spring. Multiple tabs may be used to provide stability.

One preferred embodiment of the present invention is a pre-formed battery contact to be mounted to a circuit board. The battery contact includes a pair of spaced-apart tabs, which when inserted into holes in the circuit board provide a secure mechanical connection.

It is therefore one object of the invention to provide an electrical component that mechanically secures itself to a circuit board prior to soldering without additional mechanical fasteners or requiring additional manufacturing steps before or after soldering.

It is another object of the invention to provide an electrical contact having spring-biased tabs for mounting to a circuit board.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1A:
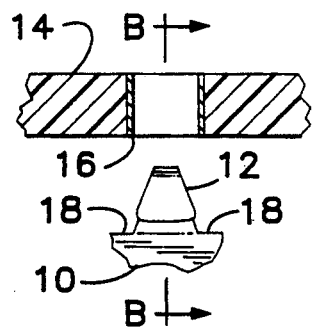
FIGS. 1A, 1B, and 1C are views of a partial electrical component having a spring-biased tab in accordance with the present invention.
Figure 1B:
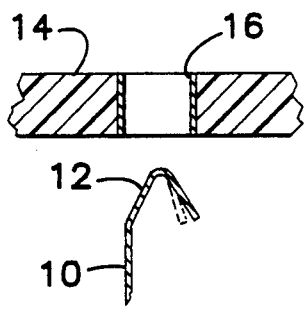
Figure 1C:
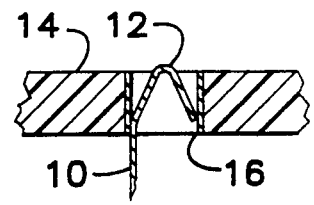

For ease of explanation of the various figures herein, like reference numerals will be used for like elements. Referring to FIGS. 1A, 1B and 1C of the drawings, there is shown a partial electrical component having a body 10 and a tab 12 integral therewith that is shaped and formed to provide a spring for securing the electrical component to a circuit board 14. FIG. 1A shows a plan view of the partial component body 10 and tab 12, while FIG. 1B shows a cross-sectional view taken along the line B—B of FIG. 1A. The component body 10 and integral tab 12 are formed of any of a number of suitable resilient, electrically-conductive sheet metals, such as phosphor bronze or a nickel silver alloy, and may be plated with a suitable metal material, such as nickel, to combine the advantages of different materials. The tab preferably is shaped and formed in a conical or pyramidal configuration to permit easy installation into a hole 16 in circuit board 14. Shoulders 18 on either side of tab 12 provide stops to limit the distance into the hole that the tab can be inserted. The longitudinal dimension of the tab should be substantially the thickness of the circuit board, with perhaps some protrusion from the opposite side of the board to provide a bridge for solder (or no protrusion at all if there are components mounted directly on the opposite side of the circuit board and no clearance is provided), but in any case not enough that would require clipping. The free end of the tab should be sufficiently spread from the fixed end of the tab so that slight deformation or spring compression, represented by the dashed line in FIG. 1B, can take place when tab 12 is inserted into the hole in the circuit board. FIG. 1C shows the tab inserted into the hole in the circuit board with the free end of the tab urged against the inner wall of the hole by the bias of the spring. Thus secured, the electrical component will remain in place until it can be soldered, and the need for additional process steps are obviated.

Figure 2A:
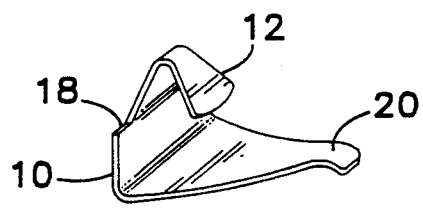
FIGS. 2A and 2B show a spring clip having a single tab for mounting a hybrid-circuit substrate to a printed circuit board.
Figure 2B:
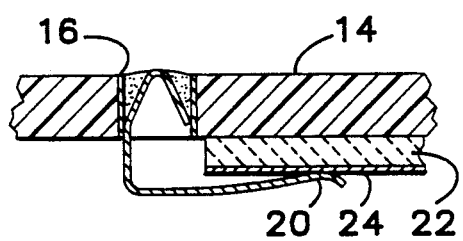

FIGS. 2A and 2B show as an exemplary embodiment a spring clip utilized for holding some other electrical component to the circuit board while providing electrical contact therewith. Tab 12 forms a spring to secure the tab into a hole in a circuit board as described above in connection with FIGS. 1A through 1C. The electrical component is a spring clip in this embodiment. The component body 10 has an elongated tongue-like member extending away from the tab end of the clip and having a contact surface 20 that bears against the circuit board 14 when the clip is installed on the circuit board. Once soldered in place as shown in FIG. 2B, an electrical component, e.g., a substrate of a hybrid circuit 22 having an electrical conductive path 24 thereon, can be slid under the tongue-like member of the clip and held in place by spring bias.

Figure 3A:
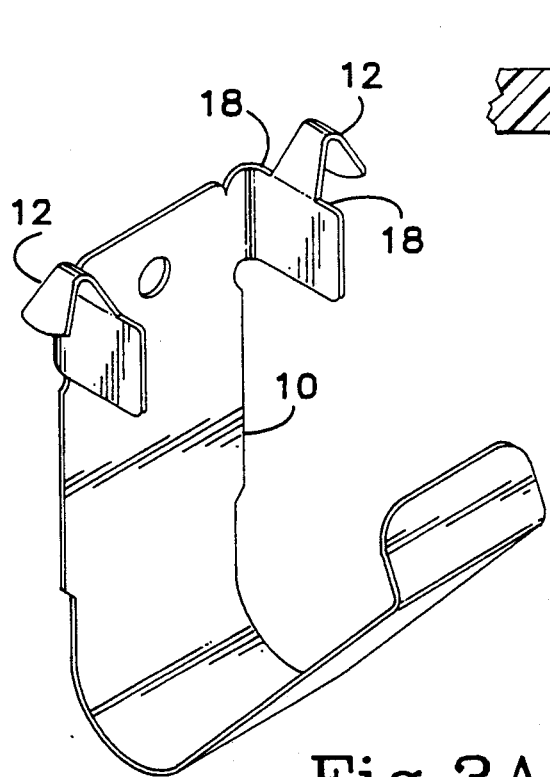
FIGS. 3A and 3B show a battery contact having a pair of tabs in accordance with a preferred embodiment of the present invention.
Figure 3B:
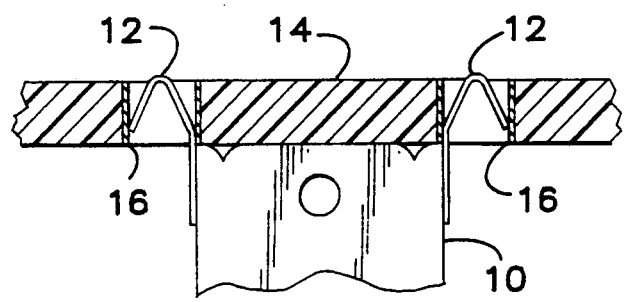

FIGS. 3A and 3B show a commercial embodiment of the present invention, which is a battery contact for use in a small hand-held electronic device such as a digital multimeter. Again, the component body 10 and tabs 12 are formed of a suitable resilient sheet metal, and two spaced-apart tabs 12 are utilized because the battery contact is comparatively large and multiple tabs provide additional stability.

Figure 4:
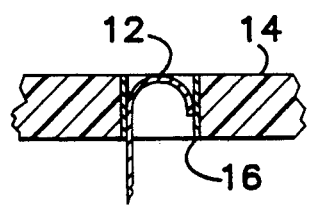
FIG. 4 shows an alternate shape for a spring-biased tab in accordance with the present invention.

The tabs 12 may be shaped differently than the preferred embodiment discussed above. FIG. 4 shows an alternate embodiment in which the tab 12 is substantially a U-shape. Also, tab 12 may be a wired bonded to component body 10 and formed to provide a spring rather than using sheet metal.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. An electrical component for mounting to a circuit board, comprising:
    a component body; and
    at least one tab of resilient conducting material having a free end extending from said component body and being received in a hole in said circuit board from one side of said circuit board without protruding appreciably from an opposite side of said circuit board,
    wherein said tab is formed to provide a spring which compresses to urge said free end of said tab against an inner wall of said hole in said circuit board, thereby to secure said electrical component to said circuit board.

2. An electrical component in accordance with claim 1 wherein said at least one tab is formed in a shape which facilitates insertion into said hole.

3. An electrical component in accordance with claim 1 wherein said component body is formed of sheet metal and said at least one tab is formed as an integral part of said component body.

4. An electrical component in accordance with claim 1 wherein said at least one tab is bonded to said component body.

* * * * *